United States Patent
Hatta

(10) Patent No.: US 7,610,756 B2
(45) Date of Patent: Nov. 3, 2009

(54) COOLING/HEATING APPARATUS AND MOUNTING APPARATUS

(75) Inventor: Masataka Hatta, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 249 days.

(21) Appl. No.: 11/682,118

(22) Filed: Mar. 5, 2007

(65) Prior Publication Data
US 2007/0204610 A1    Sep. 6, 2007

(30) Foreign Application Priority Data
Mar. 6, 2006  (JP)  ............................. 2006-060361

(51) Int. Cl.
*F01B 29/10* (2006.01)
(52) U.S. Cl. .............................. 60/524; 60/525; 60/526
(58) Field of Classification Search .................. 60/517, 60/524, 525, 526

See application file for complete search history.

(56) References Cited

U.S. PATENT DOCUMENTS

| | | | |
|---|---|---|---|
| 6,161,389 A * | 12/2000 | Sekiya et al. | 62/6 |
| 6,959,556 B2 * | 11/2005 | Inoue et al. | 62/6 |
| 2004/0025519 A1 * | 2/2004 | Inoue et al. | 62/6 |

* cited by examiner

*Primary Examiner*—Hoang M Nguyen
(74) *Attorney, Agent, or Firm*—Oblon, Spivak, McClelland, Maier & Neustadt, L.L.P.

(57) ABSTRACT

A cooling/heating apparatus for circulating the cooled or heated transfer medium to a load to thereby cool or heat the load includes a heat transfer medium circulation path and a Stirling heat engine. The Stirling heat engine includes a first and a second cylinder chamber; a first and a second piston for expanding or compressing an operation gas in the first and the second cylinder chamber; and a driving mechanism for driving the first and the second piston. When the driving mechanism is driven in a forward direction, the operation gas is expanded in the first cylinder chamber and its temperature decreases, thus cooling the heat transfer medium, whereas, when the driving mechanism is driven in a backward direction, the operation gas is compressed in the first cylinder chamber and its temperature increases, thus heating the heat transfer medium.

4 Claims, 5 Drawing Sheets

COOLING/HEATING APPARATUS AND MOUNTING APPARATUS

FIELD OF THE INVENTION

The present invention relates to a cooling/heating apparatus and a mounting apparatus, each for controlling a temperature of a target object at a specific process temperature in processing the target object such as a semiconductor wafer or the like; and, more particularly, to a cooling/heating apparatus and a mounting apparatus, each capable of reducing power consumption and suppressing failure by simplifying a system.

BACKGROUND OF THE INVENTION

A conventional cooling/heating apparatus and a conventional mounting apparatus have been used for various processing apparatuses in a semiconductor manufacturing field. Hereinafter, a cooling/heating apparatus and a mounting apparatus for use in an inspection apparatus for inspecting electrical characteristics of a semiconductor wafer will be described as an example.

A conventional inspection apparatus E includes a loader chamber L for transferring a wafer W, a prober chamber P for inspecting electrical characteristics of the wafer W transferred from the loader chamber L and a controller (not shown), as shown in FIG. 4. Further, the inspection apparatus E is configured to transfer the wafer W from the loader chamber L to the prober chamber P to inspect the electrical characteristics of the wafer W under the control of the controller and then return the wafer W to the prober chamber P.

As shown in FIG. 4, the prober chamber P includes a wafer chuck 1 capable of controlling a temperature of the wafer W mounted thereon; an XY table 2 for moving the wafer chuck 1 in an X and a Y direction; a probe card 3 provided above the wafer chuck 1 moving by the XY table 2; and a position alignment mechanism 4 for position-aligning a plurality of probes 3A of the probe card 3 with a plurality of electrode pads of the wafer W on the wafer chuck 1.

As also shown in FIG. 4, a test head T of a tester is pivotably provided on a head plate 5 of the prober chamber P and, also, the test head T and the probe card 3 are electrically connected with each other via a performance board (not shown). After setting a test temperature of the wafer W on the wafer chuck 1 between a low temperature region and a high temperature region of the temperature range, a test signal is transmitted from the tester to the probes 3A via the test head T and the performance board, thereby inspecting the electrical characteristics of the wafer W.

Accordingly, the conventional wafer chuck 1 is provided with a cooling/heating apparatus 6 for a temperature control, as shown in FIG. 5. As can be seen from FIG. 5, the cooling/heating apparatus 6 includes a first cooling liquid circulation path 62 for circulating cooling liquid between the wafer chuck 1 and a cooling liquid tank 61; a second cooling liquid circulation path 63 for circulating the cooling liquid in the cooling liquid tank 61 to be cooled or heated; a temperature sensor 64 for detecting a temperature of the cooling liquid in the cooling liquid tank 61; a temperature controller 65 operating based on the detected value of the temperature sensor 64; a temperature control mechanism 66 for cooling of heating the cooling liquid circulating through the second cooling liquid circulating path 63 under the control of the temperature controller 65; and a heater 67 provided in the second cooling liquid circulation path 63. The first and the second cooling liquid circulation path 62 and 63 are provided with a first and a second pump 62A and 63A for circulating the cooling liquid, respectively.

The temperature control mechanism 66 has a compressor 66A, a heat exchanger 66B and a coolant circulation path 66C for circulating a gaseous coolant between the compressor 66A and the heat exchanger 66B, as shown in FIG. 5. The coolant circulation path 66C includes an outgoing path, configured with a first and a second branch line 66D and 66E, allowing the gaseous coolant to flow from the compressor 66A toward the heat exchanger 66B; and an incoming path allowing the gaseous coolant to flow from the heat exchanger 66B toward the compressor 66A.

The first branch line 66D is provided with a condenser 66G having a cooling fan 66F and, also, and a first electric valve 66H and an expansion valve 66I are attached to a downstream side thereof in order. The first electric valve 66H operates under the control of the temperature controller 65. The gaseous coolant whose pressure has been raised by the compressor 66A is cooled and condensed in the condenser 66G by the cooling fan 66F and thus liquefied into a liquid coolant. By opening the first electric valve 66H, the liquid coolant thus generated reaches the heat exchanger 66B via the expansion valve 66I. In the heat exchanger 66B, the liquid coolant is vaporized to cool the cooling liquid in the second cooling liquid circulation path 63 and then returns to the compressor 66A.

A depressurization valve 66J and a second electric valve 66K are attached in the second branch line 66E in order from an upstream side toward a downstream side. The second electric valve 66K and the heater 67 operate under the control of the temperature controller 65. The gaseous coolant whose temperature and pressure have been raised by the compressor 66A is depressurized by the depressurization valve 66J and then transferred to the heat exchanger 66B via the second electric valve 66K. The high-temperature gaseous coolant heats the cooling liquid of the second cooling liquid circulation path 63 in the heat exchanger 66B and then returns to the compressor 66A. When the heating in the heat exchanger 66B is insufficient, the heater 67 is driven to compensate the insufficient heating capacity in the heat exchanger 66B. In this way, a temperature of the cooling liquid in the cooling liquid tank 61 is controlled at a specific level by the cooling/heating apparatus 6.

Japanese Patent Laid-open Application No. 2004-076982 (hereinafter, referred to as "Patent Reference 1") discloses therein a Stirling refrigeration system suitable for cooling a wafer chuck. The Stirling refrigeration system can cool an equipment (e.g., the wafer chuck) by circulating a secondary refrigerant cooled by a Stirling refrigeration unit.

However, the cooling/heating apparatus 6 for the wafer chuck 1 in FIG. 5 has a drawback in which a complicated line structure of the temperature control mechanism 66 may cause a frequent failure in various valves attached to the coolant circulation path 66C. Moreover, the power consumption is increased by the use of the heater 67 in addition to the temperature control mechanism 66 in supplementing the insufficient heating thereof.

The Stirling refrigeration system of Patent Reference 1 uses a Stirling refrigeration unit having a simple line structure with no electric valve, so that problems such as a failure in an electric valve and the like do not occur. However, the Stirling refrigeration unit is merely a cooler and thus is only applicable to a cooling system. That is, it is not applicable to a system having both functions of cooling and heating, such as the system of FIG. 5 or the like.

SUMMARY OF THE INVENTION

It is, therefore, an object of the present invention to provide a cooling/heating apparatus and a mounting apparatus, each capable of reducing power consumption and suppressing failure by simplifying a system having both functions of cooling and heating.

In accordance with a first aspect of the present invention, there is provided a cooling/heating apparatus including:

a heat transfer medium circulation path for circulating a heat transfer medium therethrough; and a Stirling heat engine for cooling or heating the heat transfer medium circulating in the heat transfer medium circulation path, the cooled or heated transfer medium being circulated to a load to thereby cool or heat the load, wherein the Stirling heat engine includes a first cylinder chamber; a second cylinder chamber communicating with the first cylinder chamber; a first and a second piston for expanding or compressing an operation gas in the first and the second cylinder chamber while moving in reciprocating motions with a specific phase difference in the first and the second cylinder chamber, respectively; and a driving mechanism for driving the first and the second piston, and wherein, when the driving mechanism is driven in a forward direction, the operation gas is expanded in the first cylinder chamber and its temperature decreases, thus cooling the heat transfer medium, whereas, when the driving mechanism is driven in a backward direction, the operation gas is compressed in the first cylinder chamber and its temperature increases, thus heating the heat transfer medium.

It is preferable that the cooling/heating apparatus of the first aspect further includes an inverter for controlling a driving of the driving mechanism.

It is preferable that the inverter operates at a variable frequency.

It is preferable that the inverter operates based on a temperature of the heat transfer medium.

In accordance with a second aspect of the present invention, there is provided a mounting apparatus including:

a mounting table for mounting thereon a target object; and a cooling/heating apparatus for cooing or heating the target object by circulating a heat transfer medium through the mounting table, wherein the cooling/heating apparatus includes a heat transfer medium circulation path for circulating the heat transfer medium; and a Stirling heat engine for cooling or heating the heat transfer medium circulating in the heat transfer medium circulation path, and wherein the Stirling heat engine has a first cylinder chamber; a second cylinder chamber communicating with the first cylinder chamber; a first and a second piston for expanding or compressing an operation gas in the first and the second cylinder chamber while moving in reciprocating motions with a specific phase difference in the first and the second cylinder chamber, respectively; and a driving mechanism for driving the first and the second piston, and wherein, when the driving mechanism is driven in a forward direction, the operation gas is expanded in the first cylinder chamber and its temperature decreases, thus cooling the heat transfer medium, whereas, when the driving mechanism is driven in a backward direction, the operation gas is compressed in the first cylinder chamber and its temperature increases, thus heating the heat transfer medium.

It is preferable that the mounting apparatus of the second aspect further includes an inverter for controlling a driving of the driving mechanism.

It is preferable that the inverter operates at a variable frequency.

It is preferable that the inverter operates based on a temperature of the heat transfer medium.

In accordance with the aspect of the present invention, there are provided a cooling/heating apparatus and a mounting apparatus having a simplified cooling and heating system and capable of reducing power consumption and suppressing failure.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENT

Figure 1:
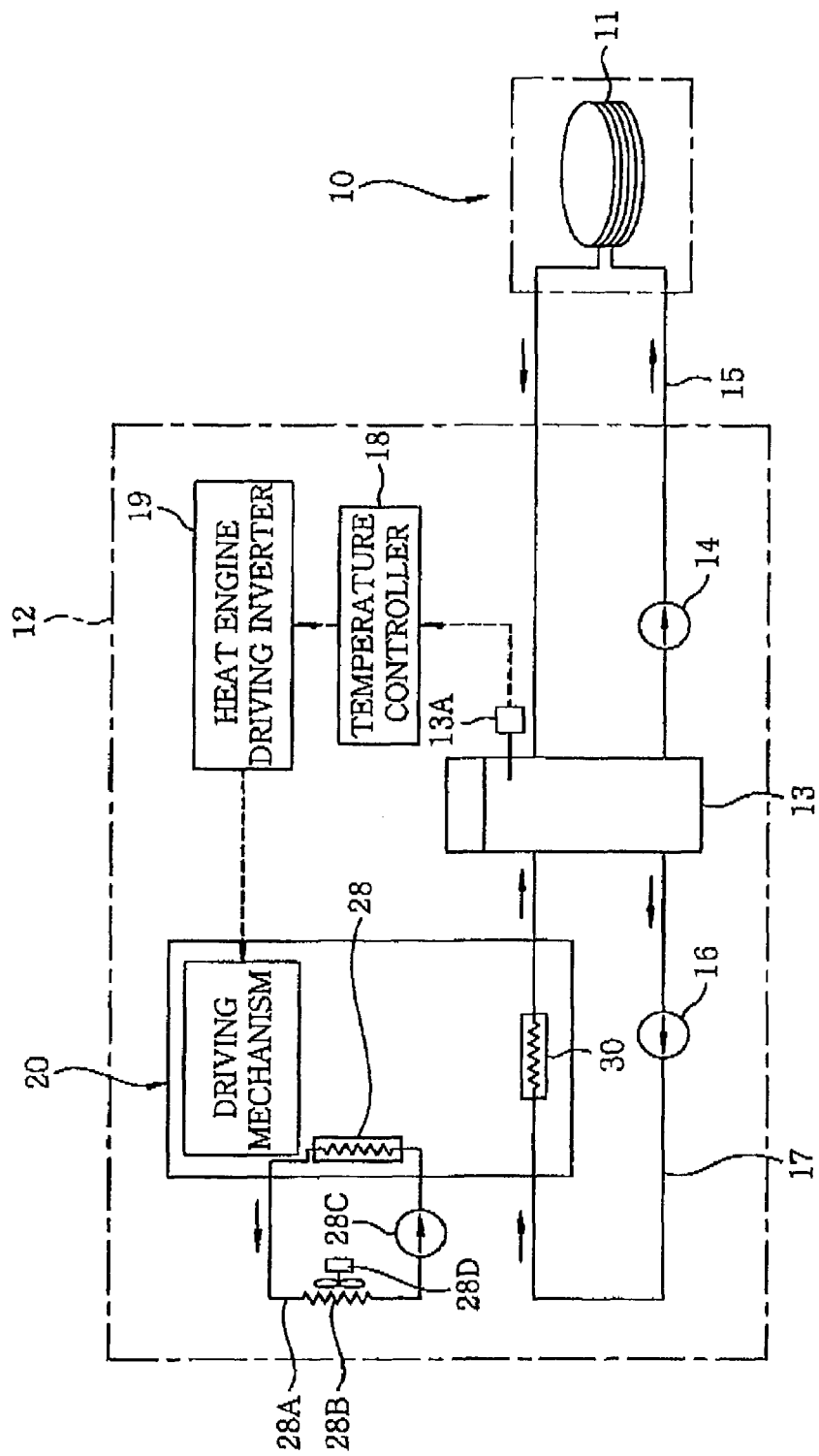
FIG. 1 shows a block diagram illustrating principal parts of a mounting apparatus employing an embodiment of a cooling/heating apparatus of the present invention.
Figure 2:
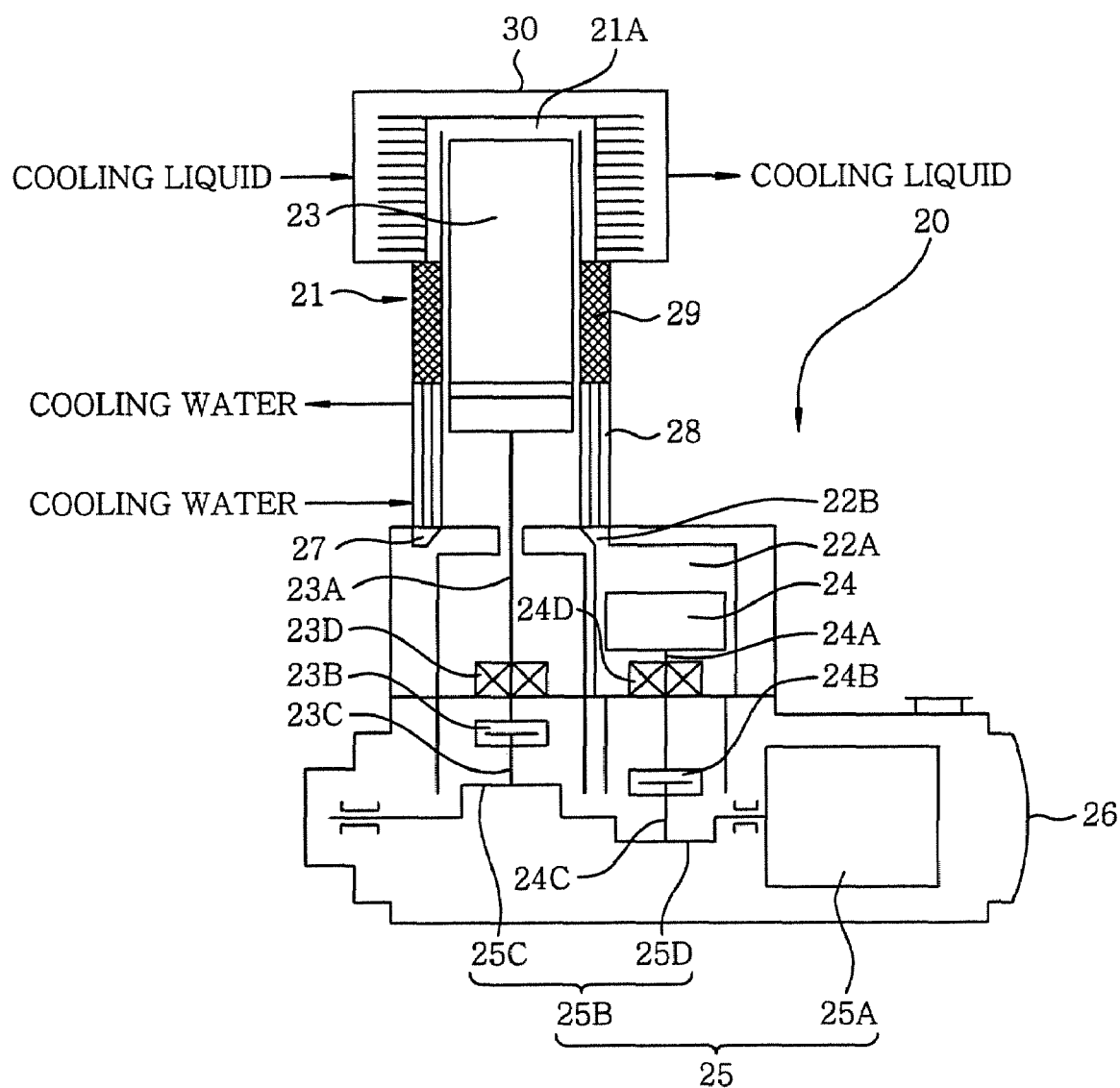
FIG. 2 describes a conceptual diagram depicting a Stirling heat engine used in the mounting apparatus of FIG. 1.
Figure 3A:
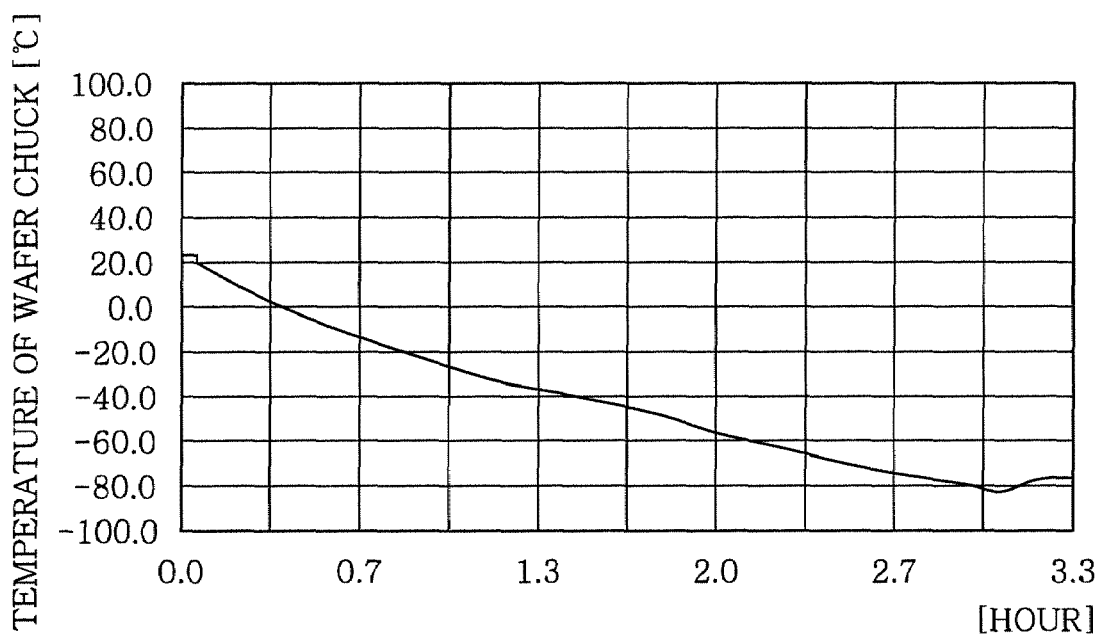
FIGS. 3A and 3B provide graphs respectively showing operations of cooling and heating using the cooling/heating apparatus of FIG. 1.
Figure 3B:
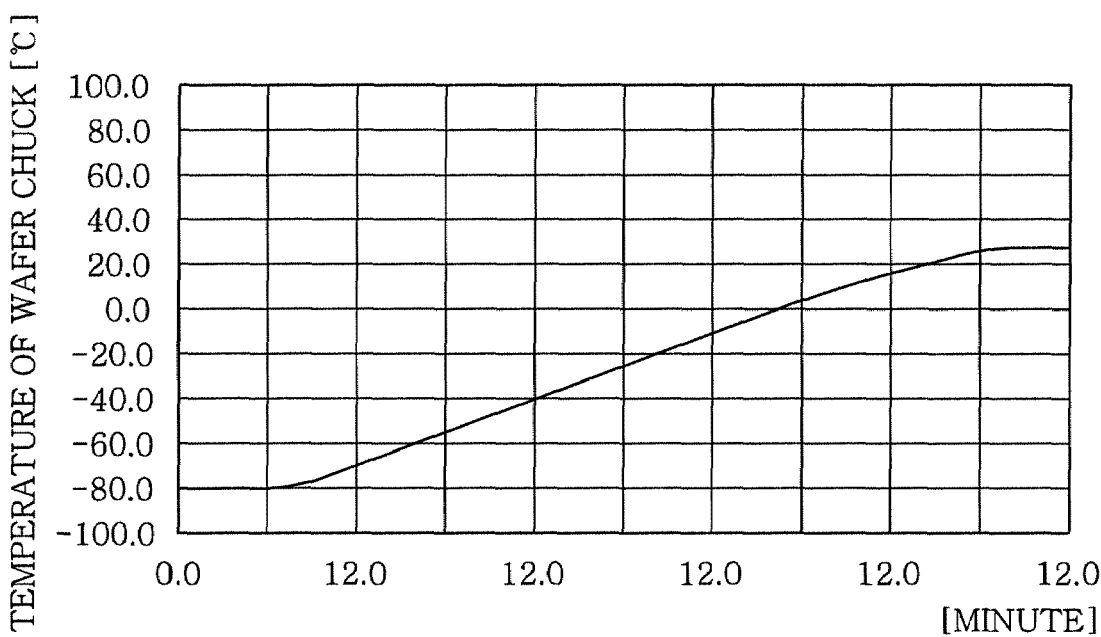
Figure 4:
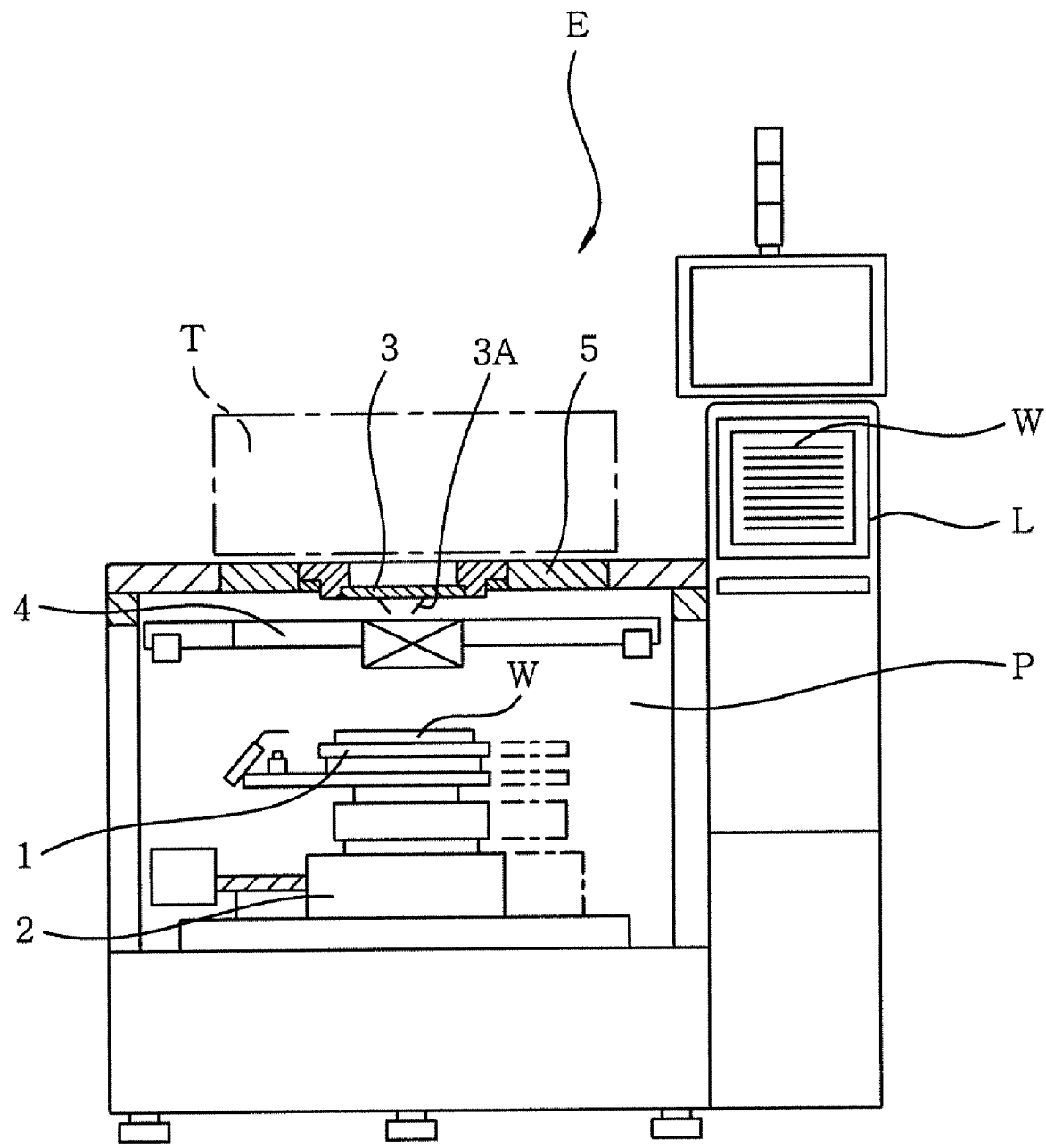
FIG. 4 presents a cross sectional view of an example of a conventional inspection apparatus.
Figure 5:
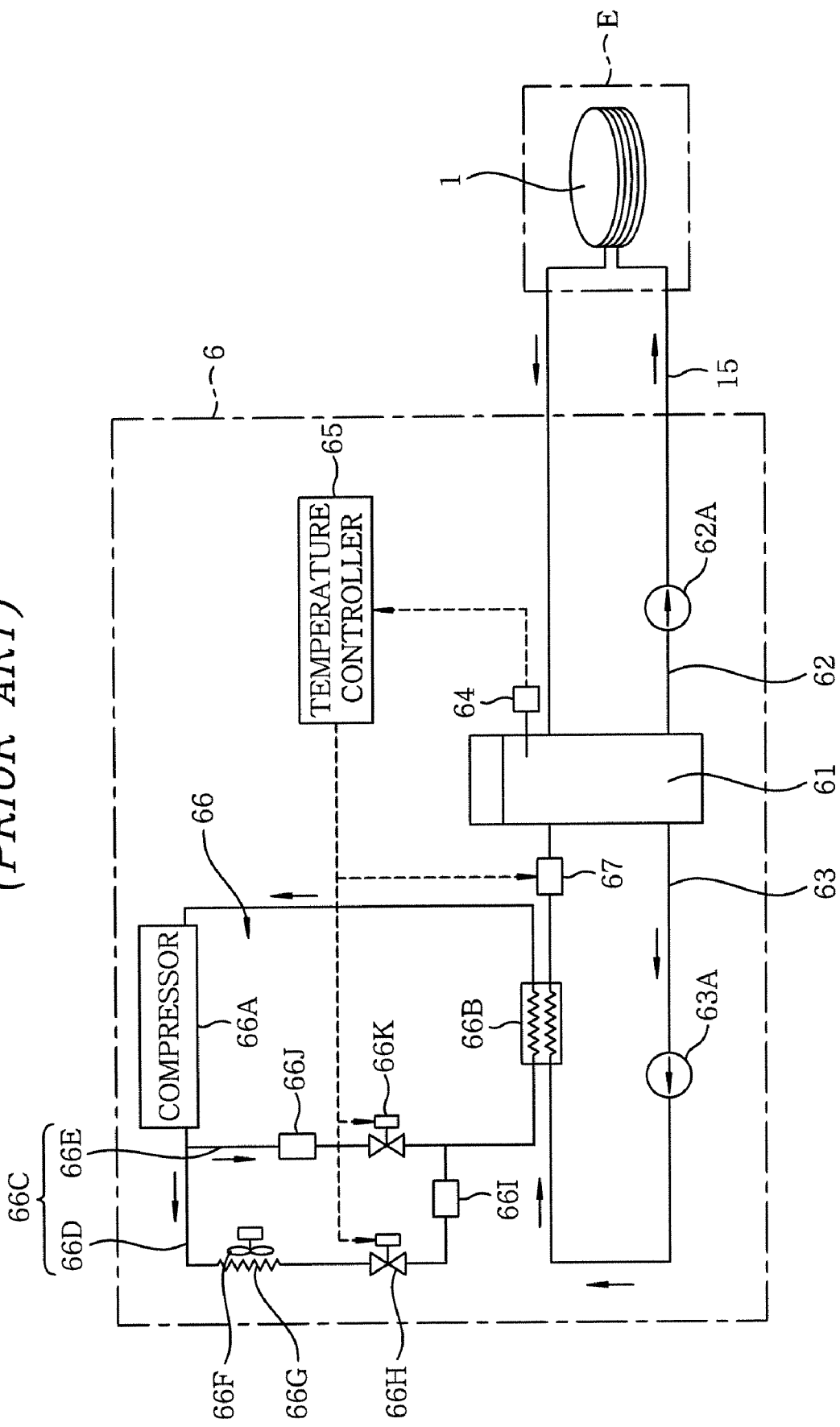
FIG. 5 represents a diagram illustrating an example of a mounting apparatus used in the inspection apparatus of FIG. 4.

Hereinafter, the present invention will be explained based on embodiments illustrated in FIGS. 1 to 3. FIG. 1 shows a block diagram illustrating principal parts of a mounting apparatus employing an embodiment of a cooling/heating apparatus of the present invention; FIG. 2 describes a conceptual diagram depicting a Stirling heat engine used in the mounting apparatus of FIG. 1; and FIGS. 3A and 3B provide graphs respectively showing operations of cooling and heating using the cooling/heating apparatus of FIG. 1.

As shown in FIG. 1, a mounting apparatus 10 of this embodiment includes a mounting table (wafer chuck) 11, provided in a prober chamber of an inspection apparatus to be movable in directions of X, Y, Z and θ, for mounting thereon a target object (e.g., wafer) (not shown); and a cooling/heating apparatus 12 for cooling or heating the wafer chuck 11. The mounting apparatus 10 is configured to control a temperature of the wafer mounted on the wafer chuck 11 at a specific test temperature by cooling or heating the wafer chuck 11.

As shown in FIG. 1, the cooling/heating apparatus 12 has a first cooling liquid circulation path 15 for circulating cooling liquid between the wafer chuck 11 and a cooling liquid tank 13 via a first pump 14; a second cooling circulation path 17 for circulating the cooling liquid of the cooling liquid tank 13 via a second pump 16; a temperature sensor 13A for detecting a temperature of the cooling liquid in the cooling liquid tank 13; a temperature controller 18 operating based on the detected value of the temperature sensor 13A; a heat engine driving inverter 19 (hereinafter, simply referred to as "inverter") operating based on a signal from the temperature controller 18; and a Stirling heat engine 20 (see FIG. 2) operating based on the signal from the inverter 19. The cooling/heating apparatus 12 is configured to heat or cool the cooling liquid flowing along the second cooling liquid circulation path 17 by using the Stirling heat engine 20.

As shown in FIG. 2, the Stirling heat engine 20 has a first cylinder 21; a second cylinder 22 placed adjacent to a lower portion of the first cylinder 21 while communicating with the first cylinder 21; a first and a second piston 23 and 24 moving in vertical reciprocating motions in cylinder chambers 21A and 22A of the first and the second cylinder 21 and 22, respectively to expand or compress a pressurized operation gas of, e.g., helium therein; a driving mechanism 25 for driving the first and the second piston 23 and 24 based on an instruction signal from the inverter 19; and a housing 26 accommodating therein the driving mechanism 25. The first and the second piston 23 and 24 move in vertical reciprocating motions with a phase difference of about 90°. Accordingly, the operation gas expanded or compressed in the first cylinder chamber 21A cools or heats the cooling liquid flowing along the second cooling liquid circulation path 17.

The first and the second cylinder 21 and 22 are formed by, e.g., a known casting technique and the like. Since the first and the second piston 23 and 24 are driven in both low and high temperature conditions under high pressure, they are preferably formed of resin having a high stiffness, a self-lubrication property and an infinitesimal thermal expansion coefficient, such as engineering plastic, e.g., polyimide, polyamideimide, polyphenylene sulfide (PPS), polyetheretherketone (PEEK) or the like. In other words, the first and the second piston 23 and 24 are heated to a temperature of about +150° C. or higher when compressing the operation gas in the first and the second cylinder chamber 21A and 22A, whereas they are cooled to a temperature of about −100° C. or lower when expanding the operation gas therein.

Therefore, the first and the second piston 23 and 24 need to be formed of a material capable of tolerating such temperature conditions. In case a lubricant is used in the first and the second piston 23 and 24, the lubricant becomes stiff at a low temperature and thus unable to perform its function. Moreover, when the lubricant is mixed with the operation gas, it is adhered to a regenerator to be described later, thus hindering the function of the regenerator. For these reasons, the lubricant is not usable in the first and the second cylinder chamber 21A and 22A and hence, it is preferable that the first and the second piston 23 and 24 are formed of the engineering plastic having a heat resistance, a cold resistance and a self-lubrication property.

The first and the second cylinder 21 and 22 are disposed on an upper left wall of the housing 26. The first cylinder 21 has a manifold 27 at a lower portion thereof. A first radiator 28, a regenerator 29 and a heat exchanger 30 are provided in order on top of the manifold 27 to surround the first cylinder chamber 21A. Further, the first and the second cylinder chamber 21A and 22A communicate with each other via the manifold 27, the first radiator 28, the regenerator 29 and the heat exchanger 30. As for the first radiator 28, the regenerator 29 and the heat exchanger 30, there are used known ones. A communication hole 22B in FIG. 2 communicates the second cylinder 22A with the manifold 27.

The first radiator 28 reaches a high temperature when the cooling/heating apparatus 12 performs the cooling operation, whereas the first radiator 28 reaches to a low temperature when the cooling/heating apparatus 12 performs the heating operation. As shown in FIG. 1, the first radiator 28 is connected with a second radiator 28B via a circulation path 28A where cooling water circulates, so that the cooling water circulates between the first radiator 28 and the second radiator 28B by a pump 28C. The second radiator 28B has a cooling fan 28D and thus cools or heats the cooing water circulating in the second radiator 28B by using the cooling fan 28D. The cooling water transfers heat to the operation gas flowing through the first radiator 28 or absorbs heat therefrom.

Hereinafter, the driving mechanism 25 of the first and the second piston 23 and 24 will be described. As shown in FIG. 2, the driving mechanism 25 includes a motor 25A as a driving source and a crankshaft 25B connected with the motor 25A. The first piston 23 is connected with a first crank 25C of the crankshaft 25B via a first piston rod 23A, a first crosshead 23B and a first connecting rod 23C. The second piston 24 is connected with a second crank 25D of the crankshaft 25B via a second piston rod 24A, a second crosshead 24B and a second connecting rod 24C. The crankshaft 25B converts a rotational motion of the motor 25A into vertical reciprocating motions of the first and the second piston 23 and 24. Reference numerals 23D and 24D in FIG. 2 indicate seal mechanisms.

The first and the second crank 25C and 25D are formed with an angle difference therebetween of about 90° along a circumferential direction of the crankshaft 25B and rotate with a phase difference of about 90° by the rotation of the crankshaft 25B. Accordingly, the first and the second piston 23 and 24 move at intervals of about ¼ cycle in reciprocating motions between a top dead center and a bottom dead center in the cylinder chambers 21A and 22A, respectively. When the motor 25A rotates forwardly, the first piston 23 moves in a reciprocating motion prior to the second piston 24 by about ¼ cycle. On the other hand, when the motor 25A rotates backwardly, the first piston 23 moves later than the second piston 24 in a reciprocating motion by about ¼ cycle. The first and the second piston stop temporarily when reversing directions at the top or bottom dead center and move slowly as approaching the top or bottom dead center, so that a small volume change of the operation gas is detected. On the other hand, they move much faster as approaching a middle point between the top and the bottom dead center, and thus a maximum volume change of the operation gas is detected.

While the forward rotation of the motor 25A of the driving mechanism 25 causes the first and the second piston 23 and 24 to be driven in reciprocating motions through following operations as one cycle, the cooling liquid flowing along the second cooling liquid circulation path 17 is cooled in the heat exchanger 30.

To be specific, in case the motor 25A is driven to rotate the crankshaft 25B forwardly, while the first piston 23 moves upward from the middle point to the top dead center in the first cylinder chamber 21A, the second piston 24 moves upward from the bottom dead center to a vicinity of the middle point in the second cylinder chamber 22A. Further, while the first piston 23 reverses its direction near the top dead center, the second piston 24 moves upward from the middle point toward the top dead center. At this time, the operation gas is compressed in the second cylinder chamber 22A and its temperature increases, thereby generating a high-temperature operation gas. In other words, the second cylinder chamber 22A serves as a high temperature chamber.

Subsequently, while the first piston 23 reverses its direction and moves downward from the top dead center toward the middle point, the second piston 24 passes the middle point and moves upward toward the top dead center. At this time, the high-temperature operation gas in the second cylinder chamber 22A moves into the first cylinder chamber 21A. To be specific, the high-temperature operation gas is discharged through the communication hole 22B of the second cylinder 22A and then passes through the manifold 27. While passing through the first radiator 28, the high-temperature operation gas radiates heat. Further, the regenerator 29 absorbs heat from the high-temperature operation gas and thus the high-temperature operation gas loses its heat to become a cooled operation gas. The cooled operation gas thus generated is introduced into the first cylinder chamber 21A via the heat exchanger 30.

While the first piston 21 passes the middle point and moves downward toward the bottom dead center in the first cylinder chamber 21A, the second piston 24 moves downward from the top dead center toward the middle point in the second cylinder chamber 22A. At this time, the cooled operation gas is rapidly expanded and becomes a low-temperature operation gas for cooling purposes. In other words, the first cylinder chamber 21A serves as a low temperature chamber. The low-temperature operation gas cools in the heat exchanger 30 the cooling liquid flowing along the second cooling liquid circulation path 17. By absorbing heat during the cooling operation, the low-temperature operation gas increases its temperature, thereby generating a heated operation gas.

Next, while the first piston 23 reverses its direction at the bottom dead center and moves upward toward the middle point in the first cylinder chamber 21A, the second piston 24 moves downward from the middle point toward the bottom dead center in the second cylinder chamber 22A. At this time, the heated operation gas moves from the first cylinder chamber 21A into the second cylinder chamber 22A. To be specific, the heated operation gas absorbs heat and increases its temperature while passing through the regenerator 29 where heat has been accumulated. Next, the temperature of the heated operation gas is adjusted while passing through the first radiator 28. Accordingly, the operation gas whose temperature has been adjusted to return to its original temperature is introduced into the second cylinder chamber 21A via the manifold 27 and the communication hole 22B. By repetitively performing the above-described series of reciprocating operation of first and the second piston 23 and 24 in the cylinder chambers 21A and 22A, the cooling liquid flowing along the second cooling liquid circulation path 17 via the heat exchanger 30 is cooled by the low-temperature operation gas in the first cylinder chamber 21A.

When the motor 25A of the driving mechanism 25 rotates backwardly, the first piston 23 moves later than the second piston 24 by about ¼ cycle. At this time, the first cylinder chamber 21A changes from a low temperature chamber to a high temperature chamber, whereas the second cylinder chamber 22A changes from a high temperature chamber to a low temperature chamber. The cooling liquid flowing along the second cooling liquid circulation path 17 is heated in the heat exchanger 30 installed to the first cylinder chamber 21A serving as the high temperature chamber.

Hereinafter, an operation of the mounting apparatus 10 will be explained. In case a wafer is subjected to a low temperature test, the cooling/heating apparatus 12 is driven to cool the wafer chuck 11. When the wafer dissipates heat during the test, the cooling/heating apparatus 12 cools the wafer via the wafer chuck 11 so that the wafer can be maintained at a specific test temperature.

In the cooling/heating apparatus 12, the cooling liquid in the cooling liquid tank 13 circulates between the first cooling liquid circulation path 15 and the wafer chuck 11 by the pump 14, thereby cooling the wafer chuck 11. The cooling liquid that has returned from the wafer chuck 11 to the cooling water tank 13 has an increased temperature due to the heat absorbed from the wafer. The temperature sensor 13A detects the increased temperature and then transmits a detection signal to the temperature controller 18. The temperature controller 18 compares the detected temperature with a preset temperature and then drives the inverter 19 based on a difference therebetween. The inverter 19 drives the Stirling heat engine 20 at a specific frequency based on an instruction signal from the temperature controller 18. The Stirling heat engine 20 allows the heat exchanger 30 to cool the cooling liquid circulating by the second pump 16 along the second cooling liquid circulation path 17.

In the Stirling heat engine 20, the driving mechanism 25 is driven based on the instruction signal from the inverter 19. When the driving mechanism 25 is driven to rotate the motor 25A forwardly, the crankshaft 25B rotates. The crankshaft 25B converts the forward rotation of the motor 25A into vertical movements of the first and the second piston 23 and 24 respectively connected with the first and the second crank 25C and 25D. The first piston 23 moves in a vertical reciprocating motion prior to the second piston 24 by about ¼ cycle.

To be specific, while the first piston 23 moves upward from the middle point toward the top dead center and reverses its direction near the top dead center in the first cylinder chamber 21A, the second piston 24 moves upward from the bottom dead center and passes the middle point in the second cylinder chamber 22A. At this time, the operation gas is compressed in the second cylinder chamber 22A and its temperature increases, thereby generating a high-temperature operation gas. Next, while the first piston 23 reverses its direction at the top dead center and moves downward toward the middle point, the second piston 24 passes the middle point and moves upward toward the top dead center. At this time, the high-temperature operation gas in the second cylinder chamber 22A moves into the first cylinder chamber 21A. To be specific, the high-temperature operation gas passes through the communication hole 22B and the manifold 27. While passing through the first radiator 28 and the regenerator 29, the high-temperature operation gas is absorbed its heat and then introduced, as a cooled operation gas, into the first cylinder chamber 21A.

Next, while the first piston 23 passes the middle point and moves downward toward the bottom dead center in the first cylinder chamber 21A, the second piston 24 moves downward from the top dead center toward the middle point in the second cylinder chamber 22A. At this time, the cooled operation gas is rapidly expanded and cooled, thereby generating a low-temperature operation gas for cooling purposes. The cooling liquid flowing through the heat exchanger 30 is cooled by the low-temperature operation gas in the first cylinder chamber 21A and then returns to the cooling liquid tank 13. The low-temperature operation gas increases its temperature by absorbing heat in the heat exchanger 30.

Thereafter, while the first piston 23 reverses its direction at the bottom dead center and moves upward toward the middle point in the first cylinder chamber 21A, the second piston 24 moves downward from the middle point toward the bottom dead center in the second cylinder chamber 22A. At this time, the low-temperature operation gas whose temperature has increased in the heat exchanger 30 moves from the first cylinder chamber 21A into the second cylinder chamber 22A. To be specific, the low-temperature operation gas increases its temperature by absorbing heat while passing through the regenerator 29 where heat has been accumulated and then undergoes a temperature adjustment while passing through the first radiator 28. Accordingly, the operation gas whose temperature has been adjusted to return to its original temperature is introduced into the second cylinder chamber 21A via the manifold 27 and the communication hole 22B.

By repetitively performing the above-described operations of first and the second piston 23 and 24, the cooling liquid flowing through the heat exchanger 30 is cooled by the low-temperature operation gas in the first cylinder chamber 21A. The cooling liquid that has been cooled returns to the cooling liquid tank 13 via the second cooling liquid circulation path 17 by the second pump 16 and then constantly maintains its temperature. Referring to the graph of FIG. 3A, there is illustrated an example of a relationship between cooling time and a temperature of the wafer chuck 11 in cooling the wafer chuck 11 with the use of the cooling/heating apparatus 12.

When the cooling capacity of the Stirling heat engine 20 is too low, it is enhanced by increasing the number of revolutions of the driving mechanism 25 by way of raising the frequency of the inverter 19 based on the signals from the temperature sensor 13A and the temperature controller 18. On the contrary, the cooling capacity of the Stirling heat engine 20 is too high, it is lowered by decreasing the number of revolutions of the driving mechanism 25 by way of lowering the frequency of the inverter 19.

When the temperature condition of the test is changed from a low temperature to a normal temperature, the wafer chuck 11 is heated from the low temperature to the normal temperature. In this case, the forward rotation of the motor 25A of the Stirling heat engine 20 is converted into the backward rotation thereof, thus rotating the crankshaft 25B backwardly. Accordingly, the first piston 23 moves in a vertical reciprocating motion later than the second piston 24 by about ¼ cycle, and the first cylinder chamber 21A serves as a high temperature chamber for heating the cooling liquid.

Specifically, when the motor 25A is driven to rotate the crankshaft 25B backwardly, the second piston 24 moves upward from the middle point toward the top dead center in the second cylinder chamber 22A. While the second piston 24 reverses its direction near the top dead center, the first piston 23 moves upward from the bottom dead center toward the top dead center in the first cylinder chamber 21A. At this time, the operation gas is compressed in the first cylinder chamber 21A and becomes a high-temperature operation gas. The high-temperature operation gas thus generated heats in the heat exchanger 30 the cooling liquid flowing along the second cooling liquid circulation path 17. As a result, the high-temperature operation gas radiates heat and is cooled, thereby generating a cooled operation gas.

Next, while the second piston 24 reverses its direction near the top dead center and moves downward toward the middle point, the first piston 23 passes the middle point and moves upward toward the top dead center. At this time, the cooled operation gas in the first cylinder chamber 21A moves into the second cylinder chamber 22A. While passing through the regenerator 29, the cooled operation gas radiates heat and is cooled. The cooled operation gas is further cooled while passing through the first radiator 28. The operation gas whose temperature has been lowered is introduced into the second cylinder chamber 21A via the manifold 27 and the communication hole 22B.

While the second piston 24 passes through the middle point and moves downward toward the bottom dead center in the second cylinder chamber 21A, the first piston 23 moves downward from the top dead center toward the middle point in the first cylinder chamber 21A. At this time, the operation gas is rapidly expanded and cooled, thereby generating a low-temperature operation gas. Next, while the second piston 24 reverses its direction near the bottom dead center and moves upward toward the middle point in the second cylinder chamber 22A, the first piston 23 moves downward from the middle point toward the lower dead point in the first cylinder chamber 21A. Accordingly, the low-temperature operation gas moves from the second cylinder chamber 22A into the first cylinder chamber 21A. While passing through the communication hole 22B, the manifold 27, the first radiator 28 and the regenerator 29, the low-temperature operation gas absorbs heat and increases its temperature. The operation gas whose temperature has been raised to its original temperature is introduced into the first cylinder chamber 21A.

By repeatedly performing the above-described operations of the first and the second piston 23 and 24, the cooling liquid flowing through the heat exchanger 30 is heated by the high-temperature operation gas in the first cylinder chamber 21A. The heated cooling liquid returns to the cooling liquid tank 13 via the second cooling liquid circulation path 17 by the second pump 16 and then is heated until the cooling liquid in the cooling liquid tank 13 reaches a normal temperature. Referring to the graph of FIG. 3B, there is shown an example of a relationship between heating time and a temperature of the wafer chuck 11 in heating the wafer chuck 11 with the use of the cooling/heating apparatus 12.

When the heating capacity of the Stirling heat engine 20 is too low, it is enhanced by increasing the number of revolutions of the driving mechanism 25 by way of raising the frequency of the inverter 19 based on the signals from the temperature sensor 13A and the temperature controller 18. On the contrary, the heating capacity of the Stirling heat engine 20 is too high, it is lowered by decreasing the number of revolutions of the driving mechanism 25 by way of lowering the frequency of the inverter 19.

As described above, in accordance with this embodiment, since the cooling/heating apparatus 12 employs the Stirling heat engine 20 for cooling and heating operations, valves may not be provided and, thus, the system of the cooling/heating apparatus 12 of the mounting apparatus 10 can be simplified. Therefore, it is possible to suppress failure and reduce power consumption. Especially, the absence of electric valves in the cooling/heating apparatus 20 makes it possible to suppress the failure. In addition, the cooling and the heating capacity can be adjusted by controlling the number of revolutions of the motor 25A of the driving mechanism 25 by using the inverter 19.

Further, in accordance with this embodiment, the presence of the inverter 19 for controlling a driving of the driving mechanism 25 of the Stirling heat engine 20, i.e., the motor 25A, makes it possible to cool or heat the cooling liquid by controlling the driving of the motor 25A based on the signal from the temperature controller 18. Furthermore, since the inverter 19 operates at a variable frequency, the number of revolutions of the motor 25A can be increased or decreased by automatically changing the frequency based on the signal from the temperature controller 18, thereby controlling the cooling and the heating capacity of the cooling liquid.

A design of the present invention may be appropriately modified without being limited to the above-described embodiments. That is, as long as a cooling/heating apparatus and a mounting apparatus employ a Stirling heat engine for cooling and heating operations, they are included in the present invention. Thus, a configuration of the Stirling heat engine is not limited to that of the Stirling heat engine used in the above-described embodiments.

The present invention can be appropriately used as a cooling/heating apparatus and a mounting apparatus for use in various industrial fields other than a semiconductor device manufacturing field.

While the invention has been shown and described with respect to the embodiments, it will be understood by those skilled in the art that various changes and modification may be made without departing from the scope of the invention as defined in the following claims.

What is claimed is:

1. A cooling/heating apparatus, comprising:
a heat transfer medium circulation path for circulating a heat transfer medium therethrough;
a heat transfer medium tank for storing the heat transfer medium;
a temperature sensor for detecting a temperature of the heat transfer medium in the tank;
a temperature controller for operating based on the detected temperature of the temperature sensor;
an inverter for operating at a variable frequency based on a signal from the temperature controller; and
a Stirling heat engine for cooling or heating the heat transfer medium circulating in the heat transfer medium circulation path based on a signal from the inverter, the cooled or heated transfer medium being circulated to a load to thereby cool or heat the load,
wherein the Stirling heat engine includes a first cylinder chamber; a second cylinder chamber communicating with the first cylinder chamber; a first and a second piston for expanding or compressing an operation gas in the first and the second cylinder chamber while moving in reciprocating motions with a specific phase difference in the first and the second cylinder chamber, respectively; and a driving mechanism for driving the first and the second piston, and
wherein, when the driving mechanism is driven in a forward direction, the operation gas is expanded in the first cylinder chamber and its temperature decreases, thus cooling the heat transfer medium, whereas, when the driving mechanism is driven in a backward direction, the operation gas is compressed in the first cylinder chamber and its temperature increases, thus heating the heat transfer medium.

2. The cooling/heating apparatus of claim 1, wherein the inverter controls a driving of the driving mechanism.

3. A mounting apparatus, comprising:
a mounting table for mounting thereon a target object; and
a cooling/heating apparatus for cooing or heating the target object by circulating a heat transfer medium through the mounting table,
wherein the cooling/heating apparatus comprises:
a heat transfer medium circulation path for circulating the heat transfer medium;
a heat transfer medium tank for storing the heat transfer medium;
a temperature sensor for detecting a temperature of the heat transfer medium in the tank;
a temperature controller for operating based on the detected temperature of the temperature sensor;
an inverter for operating at a variable frequency based on a signal from the temperature controller;
and a Stirling heat engine for cooling or heating the heat transfer medium circulating in the heat transfer medium circulation path based on a signal from the inverter, and
wherein the Stirling heat engine has a first cylinder chamber; a second cylinder chamber communicating with the first cylinder chamber; a first and a second piston for expanding or compressing an operation gas in the first and the second cylinder chamber while moving in reciprocating motions with a specific phase difference in the first and the second cylinder chamber, respectively; and a driving mechanism for driving the first and the second piston, and
wherein, when the driving mechanism is driven in a forward direction, the operation gas is expanded in the first cylinder chamber and its temperature decreases, thus cooling the heat transfer medium, whereas, when the driving mechanism is driven in a backward direction, the operation gas is compressed in the first cylinder chamber and its temperature increases, thus heating the heat transfer medium.

4. The mounting apparatus of claim 3, the inverter controls a driving of the driving mechanism.

* * * * *